(12) United States Patent
Bedell et al.

(10) Patent No.: US 8,399,933 B2
(45) Date of Patent: Mar. 19, 2013

(54) SEMICONDUCTOR DEVICE HAVING SILICON ON STRESSED LINER (SOL)

(75) Inventors: Stephen W. Bedell, Wappingers Falls, NY (US); Josephine B. Chang, Mahopac, NY (US); Chung-Hsun Lin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/365,764

(22) Filed: Feb. 3, 2012

(65) Prior Publication Data
US 2012/0199941 A1    Aug. 9, 2012

Related U.S. Application Data

(62) Division of application No. 12/575,962, filed on Oct. 8, 2009, now Pat. No. 8,138,523.

(51) Int. Cl.
  H01L 29/76    (2006.01)
  H01L 29/94    (2006.01)
  H01L 31/062   (2012.01)
  H01L 31/113   (2006.01)
  H01L 31/119   (2006.01)

(52) U.S. Cl. .................. 257/369; 257/376; 257/E27.06; 257/E27.062

(58) Field of Classification Search ............... 257/351, 257/369, 374, 376, E27.06, E27.062
See application file for complete search history.

(56) References Cited

U.S. PATENT DOCUMENTS

| | | | |
|---|---|---|---|
| 6,717,216 B1 | 4/2004 | Doris et al. | |
| 6,841,430 B2 * | 1/2005 | Sugawara et al. | 438/153 |
| 2004/0126985 A1 | 7/2004 | Bendernagel et al. | |
| 2004/0235262 A1 | 11/2004 | Lee et al. | |
| 2005/0020085 A1 | 1/2005 | Lee et al. | |
| 2005/0214997 A1 | 9/2005 | Tweet et al. | |
| 2006/0081836 A1 | 4/2006 | Kimura et al. | |
| 2006/0208342 A1 | 9/2006 | Choi et al. | |
| 2007/0122956 A1 * | 5/2007 | Chidambarrao et al. | 438/197 |
| 2007/0158743 A1 | 7/2007 | Chang et al. | |
| 2007/0277728 A1 | 12/2007 | Sadaka et al. | |
| 2008/0157292 A1 | 7/2008 | Mehrotra et al. | |
| 2008/0283824 A1 | 11/2008 | Stegen et al. | |
| 2009/0014807 A1 | 1/2009 | Tang et al. | |
| 2009/0014808 A1 | 1/2009 | Lee et al. | |
| 2009/0032874 A1 | 2/2009 | Loubet et al. | |
| 2009/0090974 A1 | 4/2009 | Costrini et al. | |
| 2009/0184374 A1 | 7/2009 | Clevenger et al. | |
| 2009/0212329 A1 | 8/2009 | Ieong et al. | |

* cited by examiner

*Primary Examiner* — Hoai V Pham
(74) *Attorney, Agent, or Firm* — Scully, Scott, Murphy & Presser, P.C.; Vazken Alexanian

(57) ABSTRACT

A method of fabricating an integrated circuit and an integrated circuit having silicon on a stress liner are disclosed. In one embodiment, the method comprises providing a semiconductor substrate comprising an embedded disposable layer, and removing at least a portion of the disposable layer to form a void within the substrate. This method further comprises depositing a material in that void to form a stress liner, and forming a transistor on an outside semiconductor layer of the substrate. This semiconductor layer separates the transistor from the stress liner. In one embodiment, the substrate includes isolation regions; and the removing includes forming recesses in the isolation regions, and removing at least a portion of the disposable layer via these recesses. In one embodiment, the depositing includes depositing a material in the void via the recesses. End caps may be formed in the recesses at ends of the stress liner.

18 Claims, 5 Drawing Sheets

FILL IN STRESS LAYER AND FINAL SPACER/BOX SILICIDE

SEMICONDUCTOR DEVICE HAVING SILICON ON STRESSED LINER (SOL)

RELATED APPLICATIONS

This application is a divisional of U.S. application Ser. No. 12/575,962, filed Oct. 8, 2009.

BACKGROUND OF THE INVENTION

1. Field Of The Invention

The present invention generally relates to semiconductor devices for integrated circuits, and more particularly to such semiconductor devices having a stress liner to enhance the performance of the devices.

1. Background Art

In general, semiconductor devices include integrated circuits having complementary pairs of P-channel transistors and N-channel transistors formed on a common semiconductor substrate. As is generally known in the art, CMOS technologies are typically used to fabricate IC (integrated circuit) chips for high density and high-performance applications due to, e.g., the high operation efficiency, high switching speed, and good scaling properties that are characteristic of CMOS devices. Technological innovations in semiconductor fabrication technologies are driving market demands for CMOS solutions for higher speed, higher integration density, and lower power applications. The downscaling of CMOS technologies to submicron design rules and beyond, however, poses technological challenges with respect to maintaining performance and reliability. For example, as device sizes are downscaled, CMOS transistors must be formed with, e.g., thinner gate electrodes, smaller channel lengths, and shallower drain/source extension diffusion regions. This downscaling generally results in transistors having higher channel resistance and higher junction/contact parasitic resistances, leading to degraded performance.

To mitigate the impact on device performance with downscaling, various state of the art CMOS fabrication techniques can be implemented to effectively reduce parasitic gate and junction resistances and increase channel conductivity. For example, DSL (dual stress liner) techniques can be incorporated in CMOS process flows as a means to enhance performance of highly-scaled CMOS devices. In general, DSL technologies are premised on findings that the application of compressive stress to the conduction channel of a P-type transistor can improve the carrier (holes) mobility within the channel, while the application of tensile stress to the conduction channel of an N-type transistor can improve the carrier (electrons) mobility within the channel. In this regard, various DSL techniques have been developed to form a compressive stress insulating liner over the gate structure of P-type transistors while forming tensile stress insulating liners over the gate structures of N-type transistor devices, so as to increase charge carrier mobility in the channels of the complementary transistors.

The deliberate introduction of strain into a silicon MOSFET channel has become an important route for improving device performance in CMOS technologies. Stress is typically coupled into the channel from the source/drain regions. However, as gate pitch is reduced in order to increase density, the size of the source/drain regions are shrinking rapidly, limiting the efficacy of such methods. Furthermore, in thin-body devices, the use of embedded source/drain elements to create stress is also not effective, due the difficulty of embedding stressed materials into a thin substrate that can effectively couple stress into the channel.

One alternative to using source/drain regions to create stress is to use stressed gate materials, which can transfer stress directly to the channel beneath it. However, the important role of the gate in both the processing used for device formation and the proper electrical functioning of the device results in extremely restrictive constraints on materials that can be considered for use in the gate, making the incorporation of significant stress difficult.

BRIEF SUMMARY

Embodiments of the invention provide a method of fabricating an integrated circuit and an integrated circuit having Silicon on a stressed liner. In one embodiment, the method comprises providing a semiconductor substrate comprising an outer semiconductor layer, and an embedded disposable layer beneath said outer semiconductor layer; removing at least a portion of the embedded disposable layer to form a void within the substrate, beneath said semiconductor layer; depositing a material in said void to form a stress liner within the substrate; and forming a transistor on said outer semiconductor layer. The semiconductor layer of the substrate separates the transistor from the stress liner.

In one embodiment, the substrate includes isolation regions; and the removing at least a portion of the disposable layer includes forming recesses in said isolation regions, and removing at least a portion of the disposable layer via said recesses. In one embodiment, the depositing includes depositing said material in the void via said recesses, and the depositing a material in the void includes adding end caps in said recesses at lateral ends of the stress liner.

In an embodiment, the disposable layer is a SiGe layer. In one embodiment, the stress liner is a compressive stress layer. In one embodiment, the stress liner is a tensile stress layer.

In an embodiment, the providing the semiconductor substrate includes forming the disposable layer in the semiconductor substrate. This forming may be done by epitaxially growing an SiGe layer on a surface of the substrate, and epitaxially growing the semiconductor layer on the SiGe layer. Also, in an embodiment, the forming the transistor includes implanting ions in the surface of the substrate to form source and drain regions, and annealing the substrate to activate the ions. In one embodiment, the annealing is done after the removing at least a portion of the disposable layer, and before the depositing the material in the void.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with a wide range of specific details. In other instances, well-known structures or processing steps have not been described in detail in order to avoid obscuring the invention.

The present invention relates to ICs. More particularly, the present invention relates to integrated circuits having stress liners which improve reliability and performance without incurring area penalties or layout inefficiencies. The invention can be applied to various types of ICs, such as memory devices including dynamic random access memories (DRAMs), static random access memories (SRAMs), non-volatile memories including programmable read-only memories (PROM) and flash memories, optoelectronic devices, logic devices, communication devices, digital signal processors (DSPs), microcontrollers, system-on-chip, as well as other types of devices.

Figure 1:
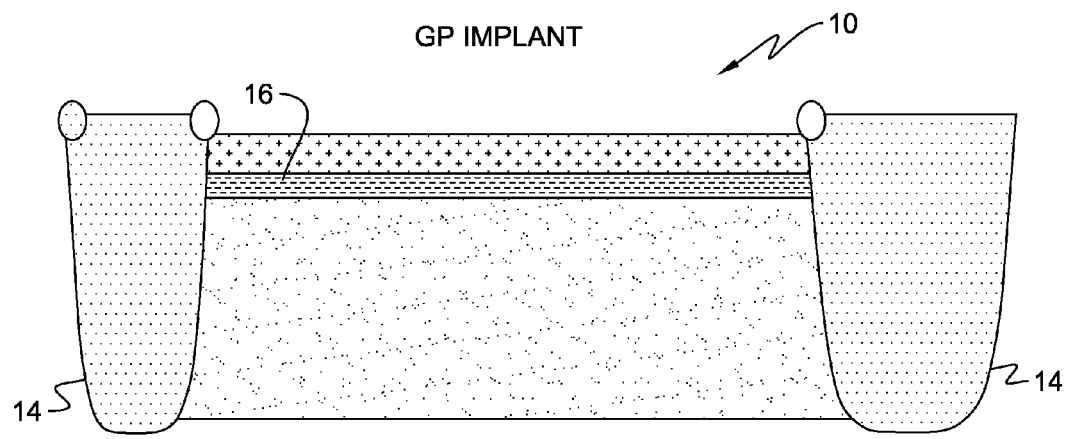
FIG. 1 shows a ground plant (GP) implant in a semiconductor structure.

FIG. 1 illustrates a semiconductor substrate 10 that may be a conventional semiconductor substrate including isolation regions 14. The base semiconductor substrate 10 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, the base semiconductor substrate 10 may be comprised of a Si-containing semiconductor material, i.e., a semiconductor material that includes silicon. Further, the base semiconductor substrate 10 may be doped or contain both doped and undoped regions. Although the base semiconductor substrate 10 may be a bulk semiconductor structure, it may also include a layered structure with one or more buried insulator layers (not shown).

Isolation regions 14 are provided to separate the structure shown in FIG. 1 from adjacent semiconductor structures. In one embodiment, the isolation regions comprise shallow trench isolation (STI) regions. STIs comprise trenches formed in the substrate 10 and filled with dielectric material, such as silicon oxide. Other types of isolation regions may also be used. For example, trenches 14 may be formed by lithography and etching.

The lithography step includes applying a photoresist to the surface of the substrate 10, exposing the photoresist and developing the exposed photoresist using a conventional resist developer. The etching step used in forming the trenches 14 may includes any standard Si directional reactive ion etch process. Other dry etching processes such as plasma etching, ion beam etching and laser ablation may also be employed. Portions of the substrate 10 that are protected by the patterned photoresist are not removed during etching. After etching, the patterned photoresist is removed utilizing a conventional resist stripping process.

A high energy, ground plant (GP) implant is performed to form a layer 16 of high concentration silicon within the semiconductor substrate 10. Any suitable GP procedure may be used to form layer 16.

Figure 2:
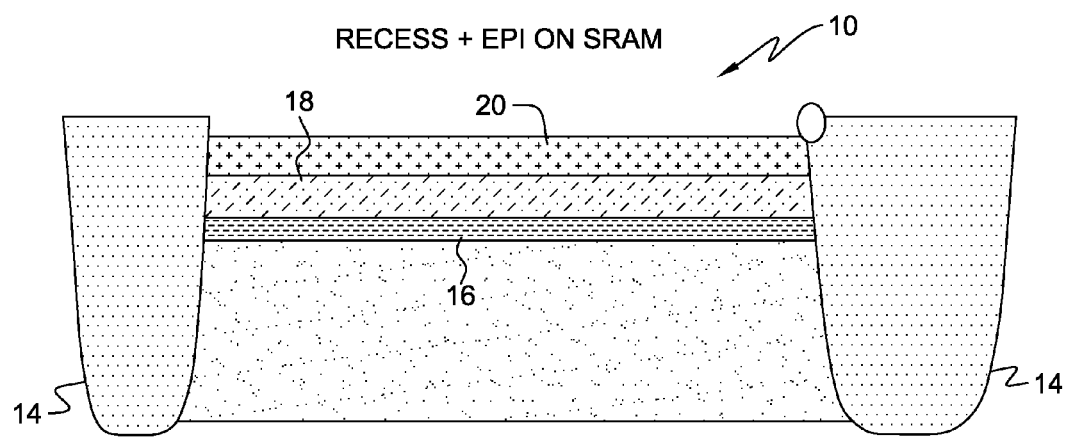
FIG. 2 illustrates SiGe and Si layers epitaxial grown in a recess formed in the semiconductor structure of FIG. 1.

Next, with reference to FIG. 2, after high concentration layer 16 is formed, the portion of substrate 10 above that layer is etched away to form a recess at the top of the semiconductor recess. Then, a SiGe layer 18 is epitaxially grown on layer 16, and a Si layer 20 is grown on that SiGe layer 18. Any suitable procedures may be used to form this recess and to grow epitaxially layers 18 and 20.

The recess etch may be any suitable etch process. For instance, a standard plasma etch machine may be used at a temperature of 40-100° C., a pressure of 1-10 torr, and with HBr, $CF_4$, and $O_2$ precursor gases.

The epitaxial SiGe layer 18 may be formed by any suitable standard process. For example, reduced-temperature chemical vapor deposition ("RTCVD"), ultra-high vacuum chemical vapor deposition ("UHCVD"), molecular beam epitaxy ("MBE"), or a small or large batch furnace-based process may be used. For example, a silicon-bearing precursor DCS (dichlorosilane), a germanium-bearing precursor $GeH_4$ (germane), and a p-doping precursor $B_2H_6$ (diborane) may be used to grow a SiGe layer. Alternatively, the epitaxial deposition process may also include a carbon-bearing precursor $SiH_3CH_3$ (mono-methyl-silane). As an example, a RTCVD process may be used at a temperature range of 450-800° C. and a pressure between 1-100 ton.

The silicon layer 20 is epitaxially grown on the SiGe layer 18. The Si layer may comprise any semiconducting material including, but not limited to Si, strained Si, SiC, SiGe, SiGeC, Si alloys, Ge, Ge alloys, GaAs, InAs, and InP, or any combination thereof. A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 550° C. to 900° C. Although a higher temperature typically results in faster deposition, the faster deposition may result in crystal defects and film cracking.

Figure 3:
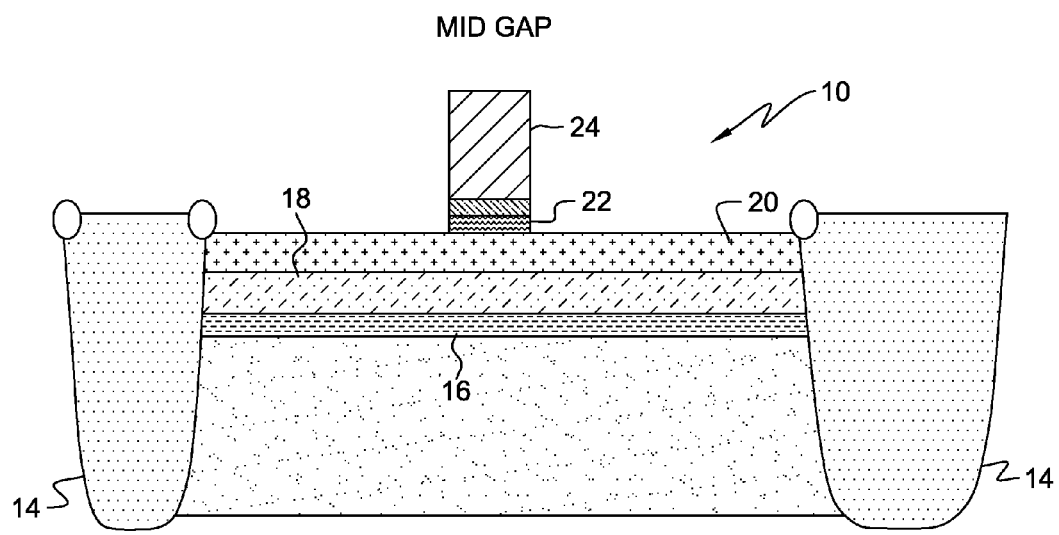
FIG. 3 depicts a gate formed on the semiconductor structure.
Figure 4:
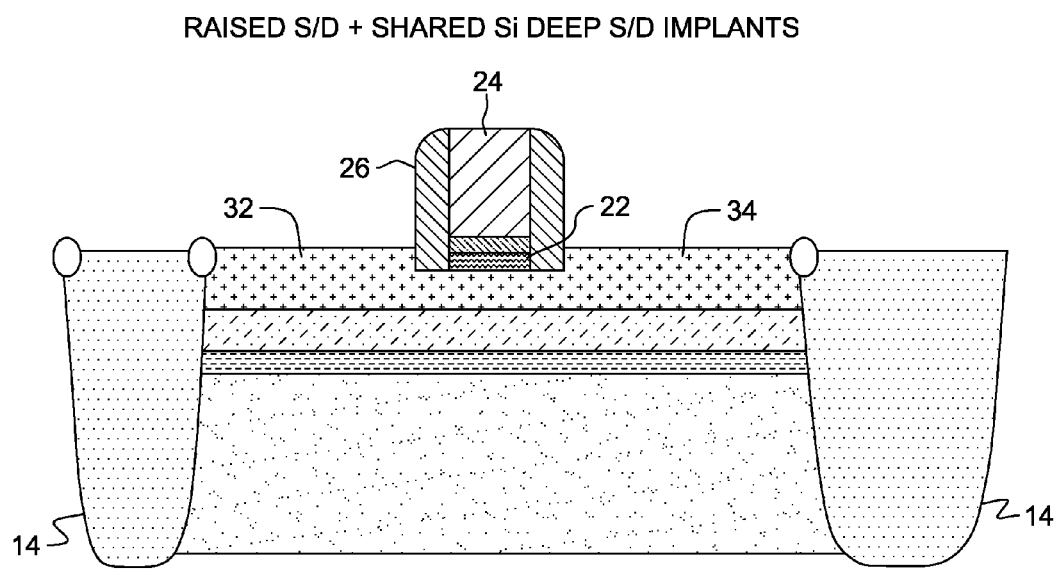
FIG. 4 shows a disposable spacer on the gate, and a source/drain implant.
Figure 5:
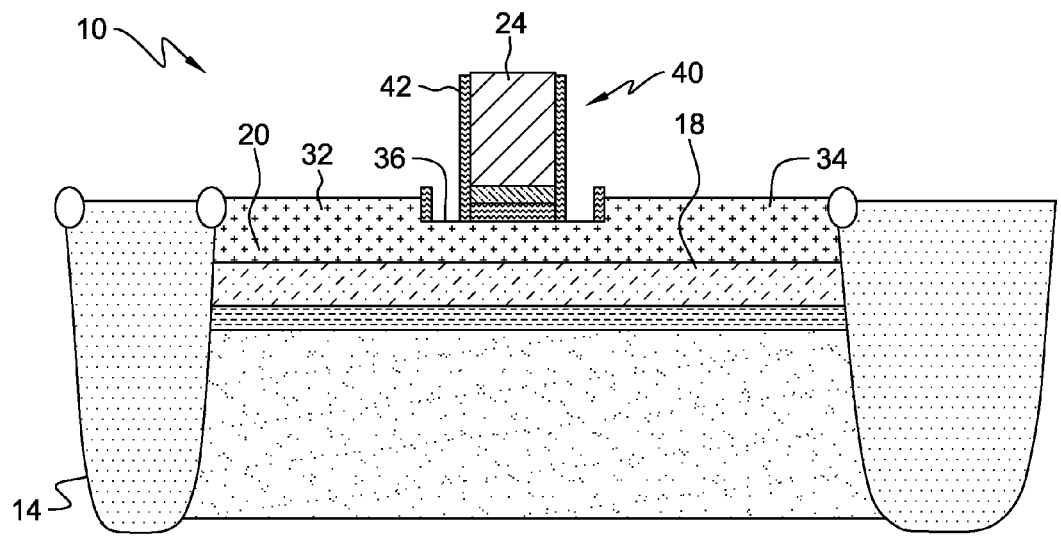
FIG. 5 shows an offset spacer around the gate of the semiconductor structure.

A gate region is then formed. With reference to FIGS. 3-5, a blanket layer of gate dielectric 22 is formed on the surface of the layer 20. The gate dielectric 22 is comprised of an insulating material having a dielectric constant of, for example, about 4.0 or greater. In one embodiment, dielectric 22 may have a dielectric constant greater than 7.0. The dielectric constants mentioned herein are relative to a vacuum, unless otherwise stated. Note that $SiO_2$ typically has a dielectric constant that is about 4.0. Specifically, the gate dielectric 22 employed in the present invention includes, but is not limited to: an oxide, nitride, oxynitride and/or silicates including metal silicates, aluminates, titanates and nitrides. In one embodiment, the gate dielectric 22 may be comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixtures thereof.

The gate dielectric 22 can be formed by a thermal growing process such as, for example, oxidation. Alternatively, the gate dielectric 22 can be formed by a deposition process such as, for example, chemical vapor deposition (CVD), plasma-assisted CVD, atomic layer or pulsed deposition (ALD or ALPD), evaporation, reactive sputtering, chemical solution deposition or other like deposition processes. The gate dielectric 22 may also be formed utilizing any combination of the above processes.

The physical thickness of the gate dielectric 22 may vary, but typically, the gate dielectric 22 has a thickness from about 0.5 to about 10 nm, with a thickness from about 0.5 to about 2 nm being more typical.

After forming the gate dielectric 22, a blanket layer of polysilicon or another gate conductor material or combination thereof, which becomes the gate conductor 24 shown in FIG. 3, is formed on the gate dielectric 22 utilizing a known deposition process such as, for example, physical vapor deposition, CVD or evaporation. The thickness, i.e., height, of the gate conductor 24 deposited at this point of the process may vary depending on the deposition process employed. Typically, the gate conductor 24 has a vertical thickness from about 20 to about 180 nm, with a thickness from about 40 to about 150 nm being more typical.

The gate conductor 24 can comprise any conductive material that is typically employed as a gate of a CMOS structure. Illustrative examples of such conductive materials that can be employed as the gate conductor 24 include, but are not limited to: polysilicon, conductive metals or conductive metal alloys, conductive silicides, conductive nitrides, polySiGe and combinations thereof, including multilayers thereof. In some embodiments, a barrier layer may be formed between multiple layers of gate conductors.

The blanket layer of gate conductor material 24 may be doped or undoped. If doped, an in-situ doping deposition process may be employed in forming the same. Alternatively, a doped gate conductor layer can be formed by deposition, ion implantation and annealing. Illustrative examples of dopant ions include As, P, B, Sb, Bi, In, Al, Ga, Ti or mixtures thereof. Typical doses for the ion implants are 1E14 ($=1\times10^{14}$) to 1E16 ($=1\times10^{16}$) atoms/cm$^2$ or more typically 1E15 to 5E15 atoms/cm$^2$. This implant, it may be noted, is optional.

With reference to FIG. 4, a disposable spacer 26 may be used during the doping of the gate conductor. With the embodiment shown in FIG. 4, the disposable spacer 26 is formed over the sidewalls of the gate electrode 24. The disposable spacer can be comprised of any suitable material; and for example this spacer can be comprised of photoresist, organic material, or anti-reflective coating (ARC) organic material. For example, an Anti-Reflective Coating can be comprised of a material such as propylene glycol monomethyl ether. The disposable spacer can be formed by forming an organic layer (such as a ARC layer) over the substrate and gate structure. Then the organic layer may be anisotropically RIE etched to form the disposable spacer. For example, the disposable spacer 26 can have a width between 10 and 1000 angstroms.

An optional dielectric cap (not shown), such as an oxide or a nitride, may be formed on the gate conductor 24. The optional dielectric cap is typically removed before or immediately after the diffusion regions to be subsequently formed have been silicided. A conventional deposition process such as CVD or PECVD can be used in forming this optional dielectric cap. When present, the optional dielectric cap may have a thickness from about 10 to about 50 nm.

Next, diffusion regions 32 and 34 are formed utilizing a conventional deep ion implantation process. The diffusion regions 32, 34, which subsequently become the source/drain regions, may have a junction depth that is less than 50 nm. The diffusion regions are present on each side of the gate structure 22, 24, 26 at the footprint thereof. The region between the diffusion regions 32, 34 directly beneath the gate structure 22, 24, 26 is the device channel 36.

The blanket gate conductor 24, the gate dielectric 22 and optionally the dielectric cap are then patterned by lithography and etching so as to provide at least one patterned gate region shown in FIG. 5 at 40. When a plurality of patterned gate regions are present, the patterned gate regions may have the same dimension, i.e., length, or they can have variable dimensions to improve device performance. Each patterned gate region at this point of the fabrication process may include at least a stack of the gate conductor 24 and the gate dielectric 22. The lithography step includes applying a photoresist to the upper surface of the gate conductor 24, exposing the photoresist to a desired pattern of radiation and developing the exposed photoresist utilizing a conventional resist developer.

The pattern in the photoresist is then transferred to the blanket layer of gate conductor 24 and the gate dielectric 22 utilizing one or more dry etching steps. In some embodiments, the patterned photoresist may be removed after the pattern has been transferred into the blanket layer of gate conductor 24. When an optional dielectric cap is present, the photoresist may be applied to the cap and the above processing is performed.

Suitable dry etching processes that can be used in forming the patterned gate region 40 include, but are not limited to: reactive-ion etching, ion beam etching, plasma etching or laser ablation. A wet or dry etching process can also be used to remove portions of the gate dielectric 22 that are not protected by the patterned gate conductor 24.

Disposable spacer 26 is removed and, with reference to FIG. 5, an offset spacer (i.e., diffusion spacer) 42 is formed on exposed sidewalls of each patterned gate region. The offset spacer 42 is comprised of an insulator such as an oxide, nitride, oxynitride, or carbon-containing silicon oxide, nitride, oxynitride, and/or any combination thereof. The offset spacer 42 can be formed by deposition and etching or by thermal techniques.

The width of the offset spacer 42 may be adjusted to compensate for different diffusion rates of p-type dopants and n-type dopants that are used in forming the diffusion regions 32 and 34. Typically, the offset spacer 42 has a lateral width from about 3 to about 20 nm, with a lateral width from about 7 to about 15 nm being even more typical. In some embodiments, the width of the offset spacer can be scaled below 3 nm or even eliminated if an advanced thermal process such as a laser anneal is used in activating the dopants within the diffusion regions 32, 34.

A halo implant may be performed at this point of the process utilizing a conventional halo ion implantation process. Although a halo ion implantation can be used, it does not represent the formation of another diffusion region. The structure including the diffusion regions 32 and 34 and offset spacer 42 is shown in FIG. 5. Alternatively, for device silicon thickness under 10 nm, a halo implant is not typically required as the device threshold voltage becomes controlled more strongly by the gate electrode.

Figure 6:
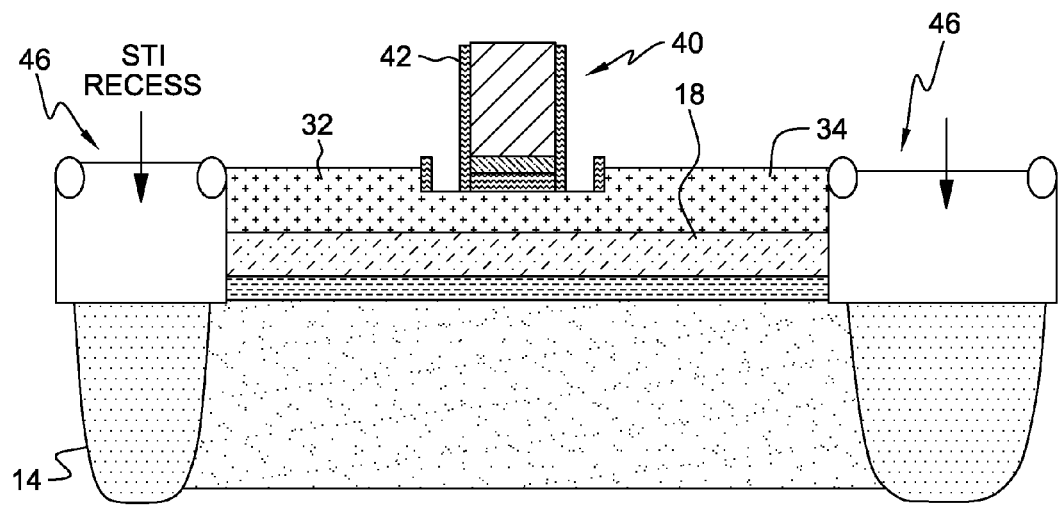
FIG. 6 illustrates recesses formed in isolation regions of the semiconductor structure.
Figure 7:
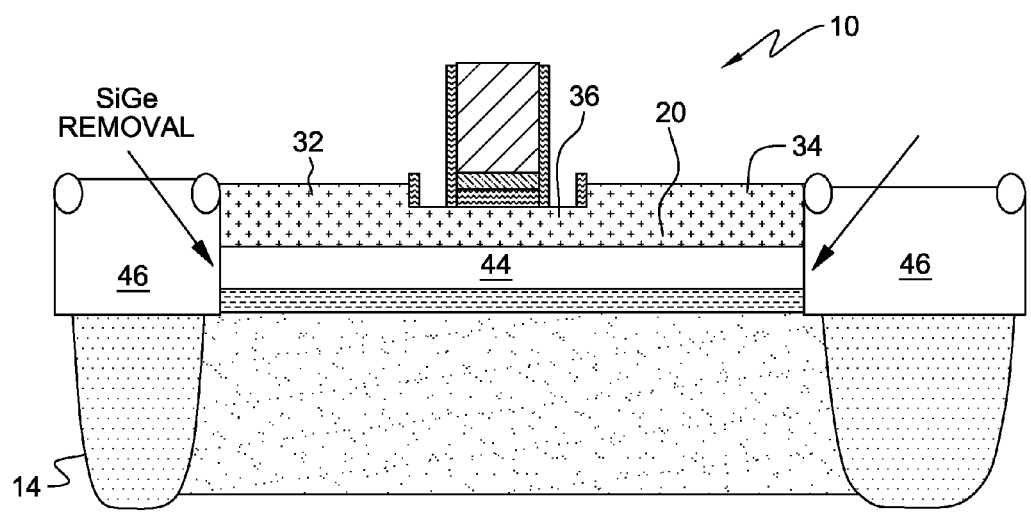
FIG. 7 depicts removal of an SiGe layer from the semiconductor structure.

The next step, illustrated in FIG. 6, is a selective etching of the isolation trenches 14 to form recesses 46, until lateral access is provided to the SiGe layer 18. This etching may be performed in a conventional manner, for example by an anisotropic plasma etch. The process then continues, as illustrated in FIG. 7, with the removal of the SiGe layer 18 by selective lateral etching. SiGe can be removed, either by oxidizing chemistry (such as by etching with a solution having 40 ml of 70% $HNO_3$+20 ml of $H_2O_2$+5 ml of 0.5% HF) or by isotropic plasma etching.

FIG. 7 illustrates a view of the substrate 10 after the etching of the trenches 14 and lateral etching of the SiGe layer 18. In the active regions, there is an empty void 44 under the silicon epilayer 20, and more specifically, directly beneath channel region 36. Layer 20 and gate region 40 may be physically supported above void 44 in any suitable way. For instance, layer 20 may be anchored at STI regions (not shown) located above and below the plane of FIG. 7. Also, supports (not shown) may be located around the void 44 to maintain the structure.

Figure 8:
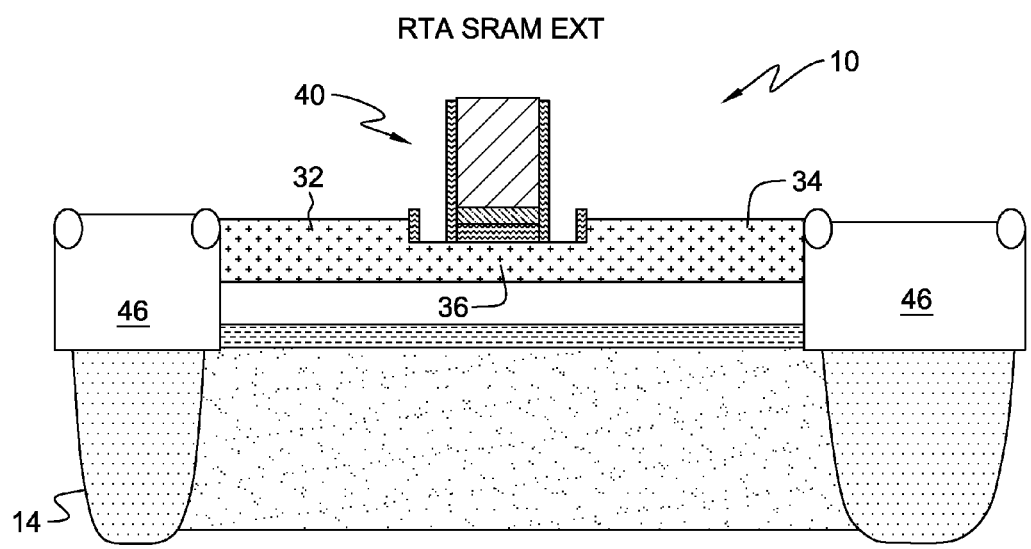
FIG. 8 shows an annealing step.

With reference to FIG. 8, after the SiGe is removed, an annealing step is performed to activate ions at the source and drain regions 32, 34. Any suitable annealing process may be employed, and for instance, a Rapid Thermal Anneal (RTA) may be used. For example, the structure may be put into the chamber of the RTA device, and heated to a temperature range between 300° C. and 600° C. for 1 to 5 minutes in an $N_2$ and $O_2$ environment. This treatment may be carried out at 0.5 to 1.5 atm using the $N_2$ and $O_2$ gas, respectively.

Figure 9:
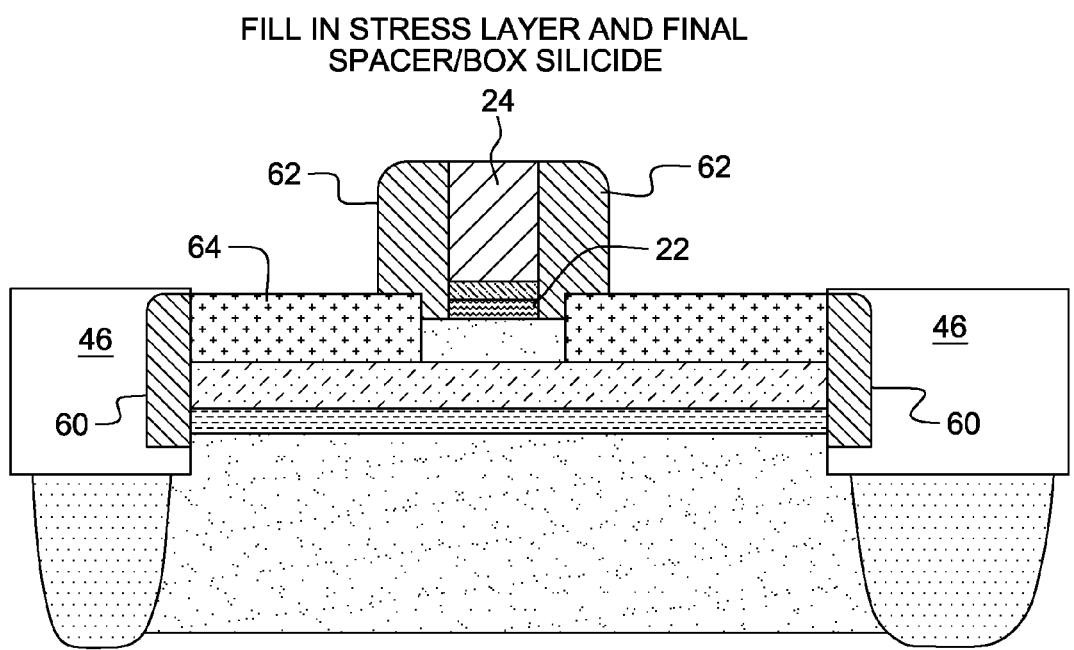
FIG. 9 illustrates formation of a stress layer inside the semiconductor structure.

With reference to FIGS. 8 and 9, void 44 is then filled with a material or materials for the purpose of fabricating a stress liner. In one embodiment, the stress inducing material comprises a tensile stress inducing material, and, for example, silicon nitride may be used. The thickness of the tensile stress layer, for example, is about 400-1000 Å and preferably about 500 Å. Other thicknesses may also be useful. Various techniques can be used to form the tensile stress layer. For example, the first stress layer can be formed using chemical deposition techniques, such as low pressure CVD (LPCVD), plasma enhanced CVD (PECVD), rapid thermal CVD (RTCVD) or BTBAS-based CVD. The tensile stress layer, in accordance with one embodiment of the invention, may be deposited by PECVD using a $SiH_4$ precursor.

In another embodiment, the stress layer comprises compressive stress material, and, for example, silicon nitride may also be used to form a compressive stress layer. Typically, the thickness of the stress layer is about 400-1000 Å. Preferably, the thickness of the second stress layer is about 600 Å. Other thicknesses are also useful. Various techniques, such as low pressure CVD (LPCVD), plasma enhanced CVD (PECVD), high density plasma CVD (HDPCVD), rapid thermal CVD (RTCVD) or BTBAS-based CVD can be used to form the second stress layer. In one embodiment, the second stress layer is formed by HDPCVD using a silane ($SiH_4$) precursor.

In another embodiment, both tensile and compressive stress liners may be formed in void 44. In this embodiment, substrate 10 may be provided with both P-type and N-type transistors, with the P-type transistor directly above the compressive stress liner, and the N-type transistor directly above the tensile stress liner.

After the stress liner is formed, silicide may be added at the ends of the stress liner to form end caps 60. The process then continues with the filling of the trenches 14 with a dielectric. This dielectric may be the same as that used in the STI process.

Additional process steps may then be used, as desired, to obtain a finished structure. For instance, a final spacer 62 may be added around gate structure 22, 24, and a top silicon layer 64 may be added on the semiconductor substrate. Spacer 62 and layer 64 may be formed or added in any suitable way, and, for example, conventional techniques may be used.

Also, a buried oxide (BOX) layer may be formed in substrate 10. A BOX layer may be formed in any suitable way. For instance, the initial substrate 10 can be formed using a layer transfer process, such as a bonding process, in which a BOX is formed. Alternatively, a technique referred to as separation by implanted oxygen (SIMOX) can be used to form a BOX layer. In this process, ions, typically oxygen, are implanted into a bulk Si-containing substrate, and then the substrate containing the implanted ions is annealed under conditions that are capable of forming a buried insulating layer, i.e., BOX. The device illustrated in FIG. 9 is then obtained.

While the present invention has been particularly shown and described with respect to preferred embodiments thereof, it will be understood by those skilled in the art that changes in forms and details may be made without departing from the spirit and scope of the present invention. It is therefore intended that the present invention not be limited to the exact forms and details described and illustrated herein, but fall within the spirit and scope of the appended claims.

The invention claimed is:

1. An integrated circuit comprising:
a semiconductor structure including an inner semiconductor layer, an outer semiconductor layer, and a stress liner formed within the semiconductor structure, above said inner semiconductor layers and beneath said outer semiconductor layer; and
a transistor formed on said outer semiconductor layer; and
wherein the outer semiconductor layer separates the transistor from said stress liner.

2. The integrated circuit according to claim 1, wherein the semiconductor structure further comprises isolation trenches at lateral ends of the stress liner.

3. The integrated circuit according to claim 2, wherein the semiconductor structure further comprises end caps in the isolation regions at the lateral ends of the stress liner.

4. The integrated circuit according to claim 3, wherein the stress layer is a compressive stress liner.

5. The integrated circuit according to claim 4, wherein the stress layer is a tensile stress liner.

6. The integrated circuit according to claim 1, wherein the inner semiconductor layer is a layer of high concentration silicon formed within the semiconductor substrate.

7. The integrated circuit according to claim 6, wherein the transistor includes:
a gate dielectric formed on the outer semiconductor layer, and
a gate conductor formed on the gate dielectric.

8. The integrated circuit according to claim 7, wherein the substrate further comprises:
a device channel formed in the outer semiconductor layer, above the stress liner and directly beneath the gate dielectric.

9. The integrated circuit according to claim 1, wherein:
the stress liner includes first and second lateral ends, and
the semiconductor structure includes first and second isolation regions at lateral ends of the semiconductor structure;
the semiconductor structure defines recesses in said isolation regions, in communication with the stress liner, to provide access to the stress liner from the lateral ends of the semiconductor device.

10. The integrated circuit according to claim 9, wherein the semiconductor structure further includes a pair of end caps formed in the recesses at the lateral ends of the stress liners; and
the end caps are formed of a silicide.

11. The integrated circuit according to claim 9, wherein:
the stress liner is formed in the substrate, after the inner and outer semiconductor layers are formed.

12. The integrated circuit according to claim 11, wherein:
the stress liner is formed in a void between the inner and outer semiconductor layers.

13. The integrated circuit according to claim 11, wherein:
the stress liner is formed in said void via said recesses in said isolation regions.

14. An integrated circuit comprising:
a semiconductor structure including an outer semiconductor layer, a compressive stress liner, and a tensile stress liner formed within the semiconductor structure, above said inner semiconductor layers and beneath said outer semiconductor layer; and
a P-type transistor and an N-type transistor formed on said outer semiconductor layer; and
wherein the P-type transistor is directly above the compressive stress liner and the N-type transistor is directly above the tensile stress liner, and the outer semiconductor layer separates the transistors from the stress liners.

15. The integrated circuit according to claim 14, wherein the semiconductor structure further comprises isolation trenches at lateral ends of the stress liners.

16. The integrated circuit according to claim 15, wherein the semiconductor structure further comprises end caps in the isolation regions at the lateral ends of the stress liners.

17. The integrated circuit according to claim 16, wherein the semiconductor structure further comprises isolation trenches at the lateral ends of the stress liners.

18. The integrated circuit according to claim 17, wherein the end caps are formed in said isolation trenches.

* * * * *